(12) United States Patent
Ishikawa

(10) Patent No.: US 9,305,891 B2
(45) Date of Patent: Apr. 5, 2016

(54) SEMICONDUCTOR INTEGRATED CIRCUIT WITH TSV BUMPS

(71) Applicant: Renesas Electronics Corporation, Kawasaki-shi, Kanagawa (JP)

(72) Inventor: Kenichi Ishikawa, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/616,682

(22) Filed: Feb. 7, 2015

(65) Prior Publication Data

US 2015/0145053 A1    May 28, 2015

Related U.S. Application Data

(63) Continuation of application No. 14/088,466, filed on Nov. 25, 2013, now Pat. No. 8,994,110.

(30) Foreign Application Priority Data

Nov. 28, 2012 (JP) ................................ 2012-260185
Oct. 21, 2013 (JP) ................................ 2013-218410

(51) Int. Cl.
| | |
|---|---|
| *H01L 23/62* | (2006.01) |
| *H01L 23/00* | (2006.01) |
| *H01L 23/528* | (2006.01) |
| *H01L 27/02* | (2006.01) |
| *H01L 23/60* | (2006.01) |
| *H01L 25/18* | (2006.01) |

(52) U.S. Cl.
CPC ............ *H01L 24/14* (2013.01); *H01L 23/5286* (2013.01); *H01L 27/0292* (2013.01); *H01L 23/60* (2013.01); *H01L 24/16* (2013.01); *H01L 25/18* (2013.01); *H01L 27/0266* (2013.01); *H01L 2224/13014* (2013.01); *H01L 2224/13025* (2013.01); *H01L 2224/14131* (2013.01); *H01L 2224/16146* (2013.01); *H01L 2924/10253* (2013.01); *H01L 2924/1305* (2013.01); *H01L 2924/13091* (2013.01); *H01L 2924/14* (2013.01)

(58) Field of Classification Search
CPC ..... H01L 23/5286; H01L 23/60; H01L 24/16; H01L 2224/16146; H01L 24/14; H01L 27/0292
See application file for complete search history.

(56) References Cited

U.S. PATENT DOCUMENTS

| | | | |
|---|---|---|---|
| 7,332,748 B2 | 2/2008 | Kodama et al. | |
| 8,994,110 B2 * | 3/2015 | Ishikawa | ........................ 257/355 |
| 2010/0133678 A1 | 6/2010 | Saiki et al. | |

FOREIGN PATENT DOCUMENTS

JP    2010-135391 A    6/2010

OTHER PUBLICATIONS

JEDEC Standard, "Wide I/O Single Data Rate", JESD229, Dec. 2011 (http:// www.jedec.org/standard-documents/results/jesd229).
JEDEC, "Mobile Memory Forum:LPDDR3 and WideIO", Jun. 24, 2011 (http://www.jedec.org/sites/default/files/sophie_Dumas_11%2006%20mobile%20memory%20Forum.pdf), p. 26.

* cited by examiner

*Primary Examiner* — Jose R Diaz
(74) *Attorney, Agent, or Firm* — Shapiro, Gabor and Rosenberger, PLLC

(57) ABSTRACT

A semiconductor integrated circuit is provided. In the semiconductor integrated circuit, each of ESD protection circuitries is disposed between two of TSV bumps arrayed in a matrix, the two being arranged adjacent to each other. First main power lines are disposed to overlap P-channel ESD protection elements. Second main power lines are disposed to overlap N-channel ESD protection elements. The first and second main power lines are arranged orthogonally to each other.

2 Claims, 24 Drawing Sheets

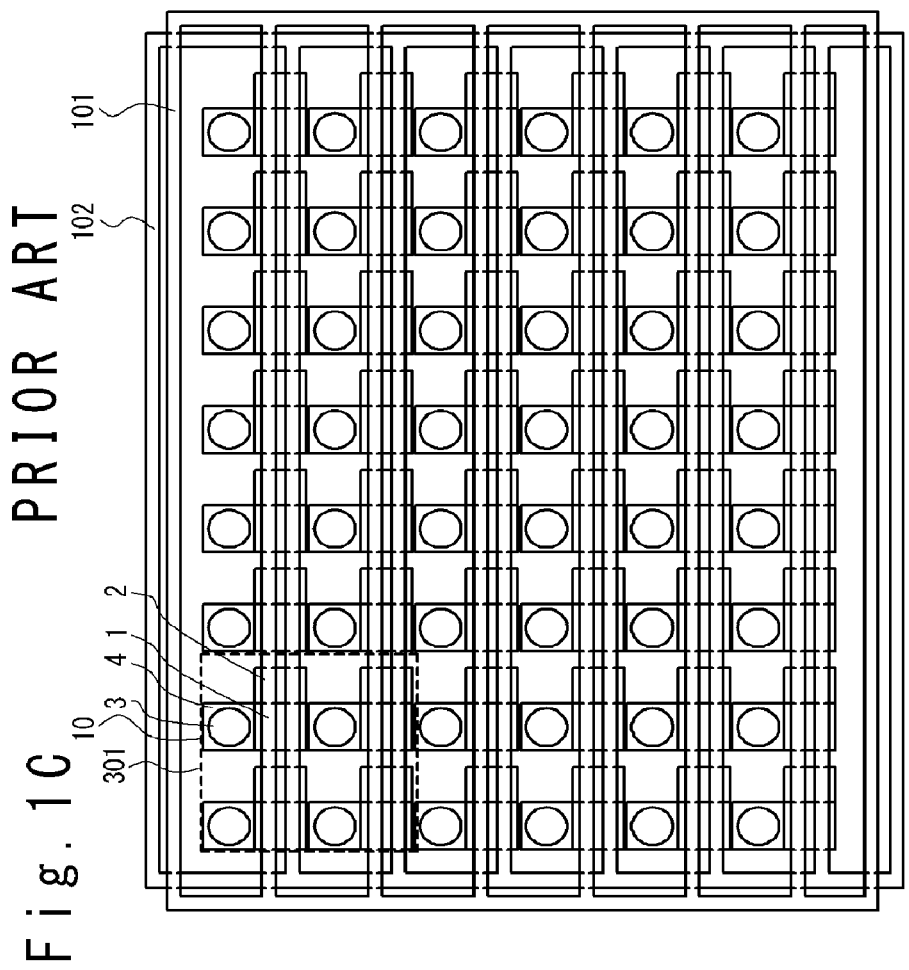

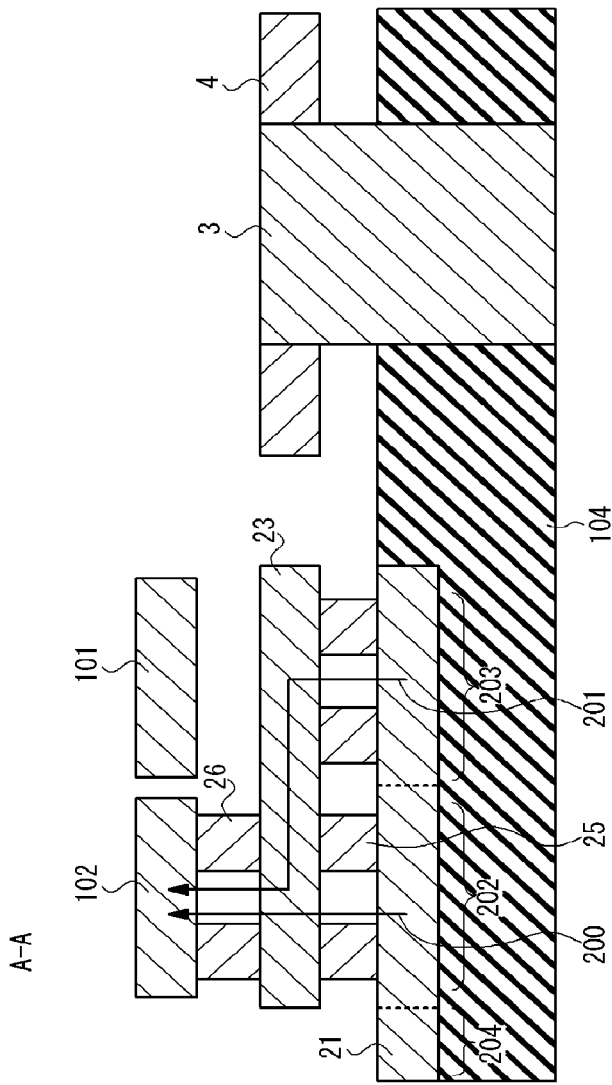

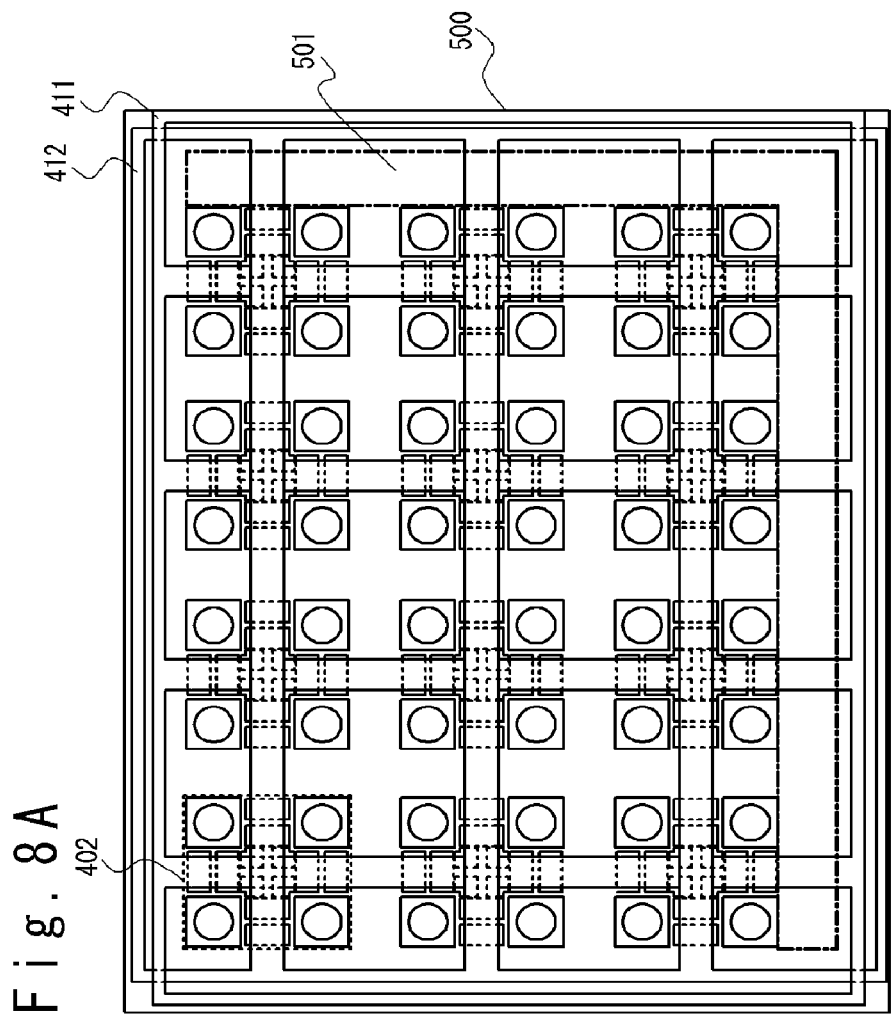

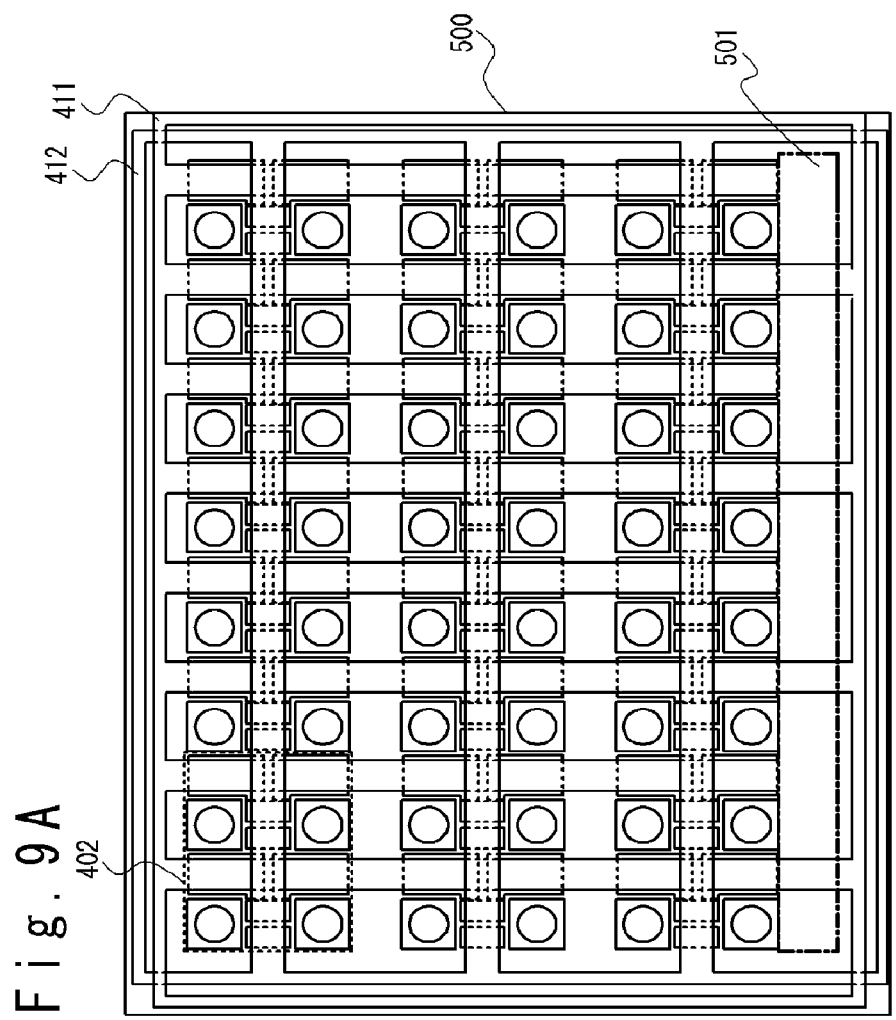

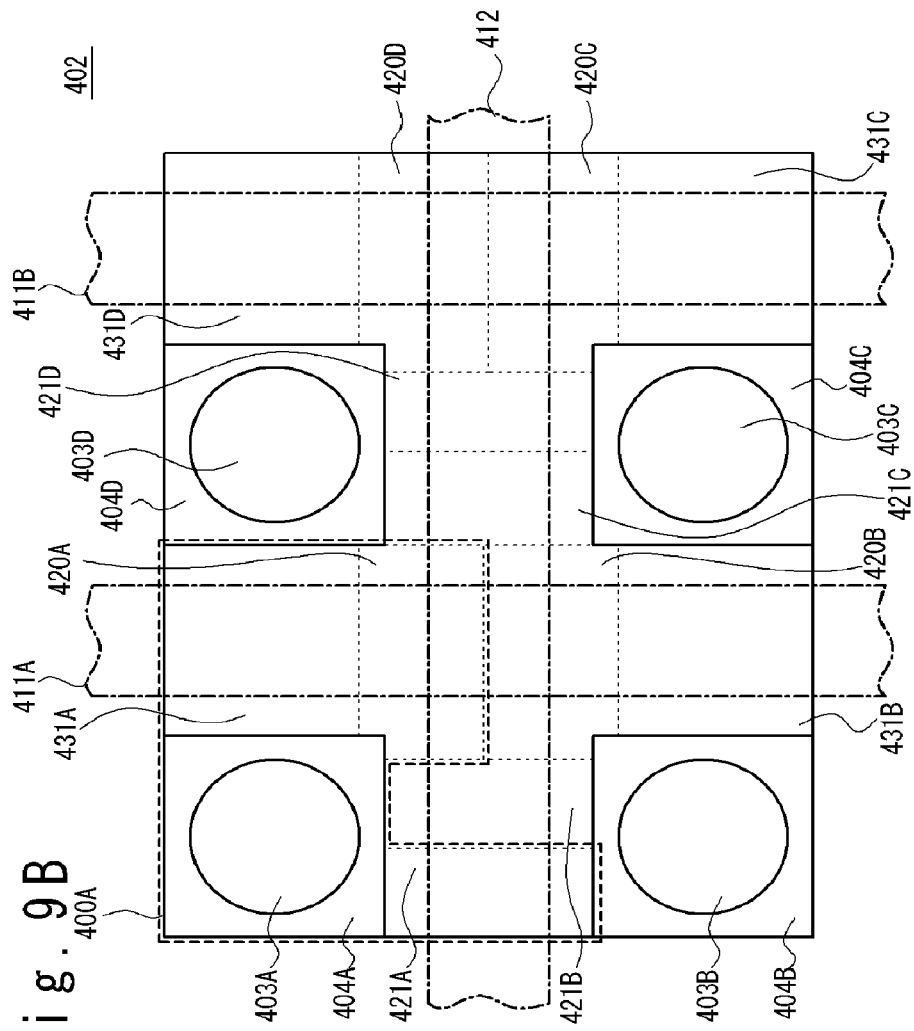

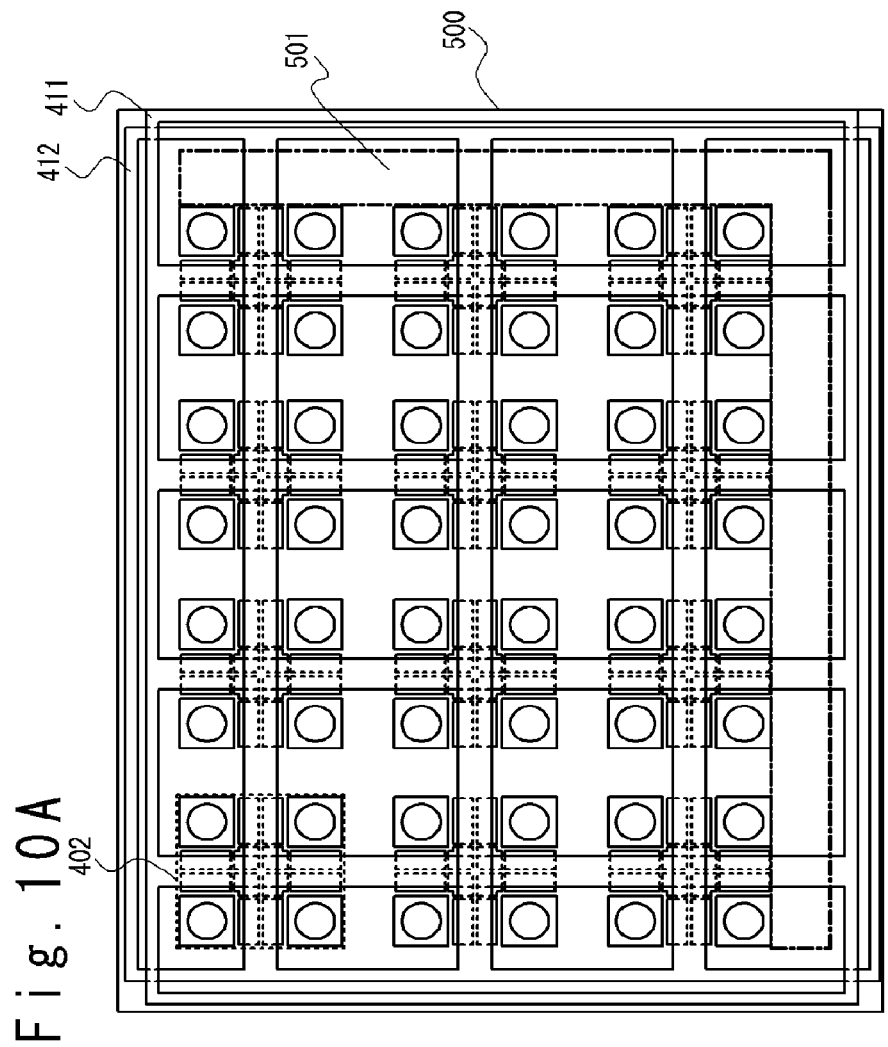

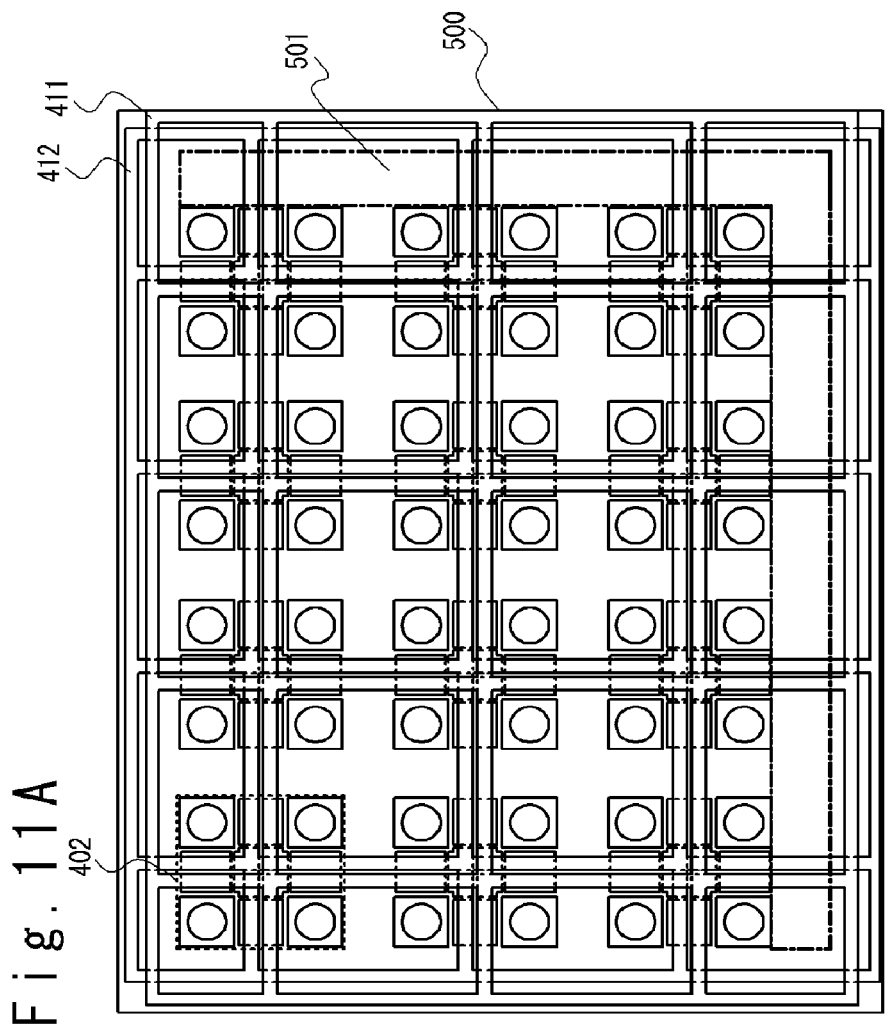

US 9,305,891 B2

SEMICONDUCTOR INTEGRATED CIRCUIT WITH TSV BUMPS

INCORPORATION BY REFERENCE

This application claims the benefit of priority based on Japanese Patent Application No. 2012-260185, filed on Nov. 28, 2013, and Japanese Patent Application No. 2013-218410, filed on Oct. 21, 2013. The disclosures of Japanese Patent Applications Nos. 2012-260185 and 2013-218410 are incorporated herein by reference.

BACKGROUND ART

The present invention is related to a semiconductor integrated circuit and suitably used for a semiconductor integrated circuit with a layout based on a TSV bump technique, in which a plurality of TSV (through silicon via) bumps arrayed in a matrix, such as a wide I/O (input/output) and a HBM (high bandwidth memory).

Recently, there exists an increasing demand of mobile DRAMs (dynamic random access memories) with a lower power consumption and a higher data transmission rate in applications to smart phones, slate type or tablet type personal computers (PCs) and the like. There are two generally known techniques for increasing the data transmission rate of a memory; one is to increase the operation frequency of the input/output bus and the other is to enlarge the bit width of the input/output bus. The use of the technique of increasing the data transmission rate by increasing the operation frequency, such as LPDDR (low power double data rate) type memories, however, may result in an increase in the power consumption.

A technique called wide I/O is known in the art in connection with LPDDR. In a wide I/O, the total number of input/output pins is increased to increase the width of the input/output bus; this allows keeping a high data transmission rate and reducing power consumption, with a lower operation frequency.

An implementation of a wide I/O technique basically requires silicon chip stacking in which circuits are electrically connected each other via TSVs formed through the stacked semiconductor substrates. Accordingly, the positions of input/output pads of a DRAM and a SOC (system on chip) device should be aligned. The arrangement of input/output pads in the wide I/O region is standardized by JEDEC (Joint Electron Devices Engineering Council).

FIG. 1A is an example of the structure of a stack of serially-connected silicon chips. In the structure example shown in FIG. 1A, a plurality of DRAM silicon chips each having an elemental device 351 and an interconnection layer 352 are stacked. These silicon chips are connected via micro bumps 351 and TSVs 356. There silicon chips are electrically connected to an interconnection layer 354 of an SoC device 353 via via-contacts provided through the SoC device 353. The SoC device 353 is mounted on a package substrate 355 which have bumps 363.

As disclosed in non-patent literature 1 (the JEDEC standard, entitled "wide I/O single data rate", JESD 229, December 2011), JEDEC (or Solid State Technology Association) has standardized the arrangement coordinates and definitions of the input/output pads of the wide I/O region connected to an SoC device or a DRAM. FIG. 1B is a plan view illustrating an example of the structure in which I/O buffers are located under bumps arranged in a TSV array region. FIG. 1B illustrates a region in which TSV bumps and buffers (denoted by numeral 901) are arranged in a rectangular matrix as well as a region in which ESD protection circuitries 902 and a PLL circuitry 903 are arranged.

The arrangement of TSV bumps and I/O buffers connected to input/output pads standardized by JEDEC is disclosed as a SoC floor plan of a wide I/O in non-patent literature 2 (proceedings of Mobile Memory Forum: LPDDR3 and Wide I/O, which is held on Jul. 24, 2011 in Korea).

In connection with non-patent literatures 1 and 2, a structure is known in which a main VDD power line is connected to a TSV bump via a P-channel ESD (electrostatic discharge) protection element and a main VSS power line is connected to the TSV bump via an N-channel ESD protection element.

Patent literature 1 (JP 2010-135391 A) discloses a structure in which P-channel and N-channel ESD protection elements are disposed at adjacent two sides of a TSV bump and a pre-amplifier circuitry of an I/O buffer is disposed between the P-channel and N-channel ESD protection elements.

SUMMARY OF THE INVENTION

In one embodiment, two ESD protection elements respectively connected to adjacent two TSV bumps are disposed between the two TSV bumps. This effectively reduces the power consumption of the wide I/O region and also reduces the chip size.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1C is a plan view illustrating an example of the layout structure of a conventional semiconductor integrated circuit;

FIG. 3A is a sectional view illustrating an example of the cross section structure of the conventional semiconductor integrated circuit on section A-A illustrated in FIG. 2A;

FIG. 8A is a plan view illustrating an exemplary layout structure of a semiconductor integrated circuit according to a third embodiment;

FIG. 9A is a plan view illustrating an exemplary layout structure of a semiconductor integrated circuit according to a fourth embodiment;

FIG. 9B is a plan view illustrating an exemplary structure of a unit structure set which forms the layout structure of the semiconductor integrated circuit in the fourth embodiment;

FIG. 10A is a plan view illustrating an exemplary layout structure of a semiconductor integrated circuit according to a fifth embodiment;

FIG. 11A is a plan view illustrating an exemplary layout structure of a semiconductor integrated circuit according to a sixth embodiment;

DESCRIPTION OF THE PREFERRED EMBODIMENTS

Embodiments will be now described herein with reference to the attached drawings. For fully explaining an objective of the present invention, a description is first given of a conventional semiconductor integrated circuit.

Figure 1A:
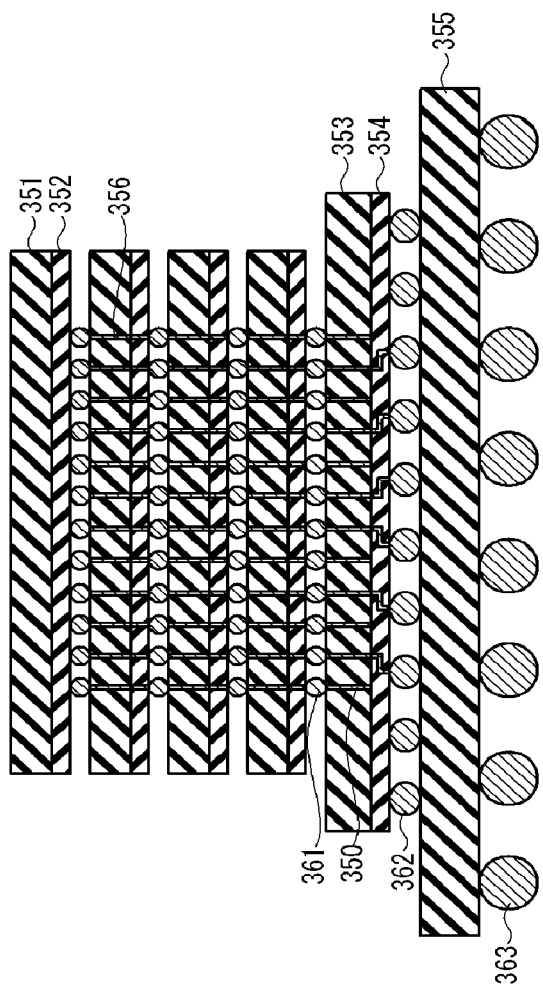
FIG. 1A is a sectional view illustrating an example of the structure of a stack of multiple silicon chips.

FIG. 1C is a plan view illustrating an exemplary layout structure of a conventional semiconductor integrated circuit. A description is given below of respective elements of the layout structure illustrated in FIG. 1C. The layout structure includes a plurality of unit structures 10, main VSS power lines 101 and main VDD power lines 102. Each unit structure 10 includes an ESD protection circuitry 1, an arbitrarily-designed circuitry 2, a TSV bump 3 and a TSV interconnection 4. The unit structures 10 are arrayed in rows and columns. A set of four unit structures 10 arrayed in two rows and two columns are referred to as unit structure set 301.

Figure 1B:
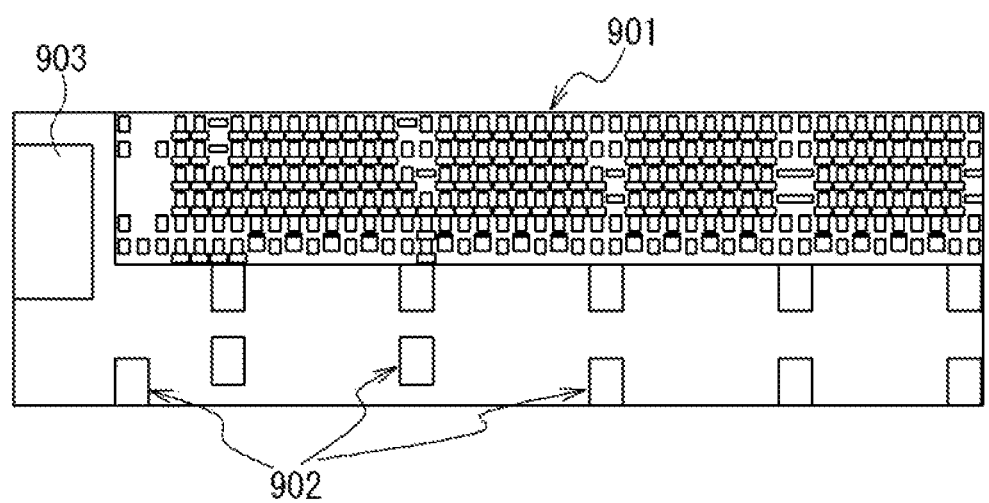
FIG. 1B is a plan view illustrating a structure in which I/O buffers are located under bumps in a TSV array region.
Figure 2A:
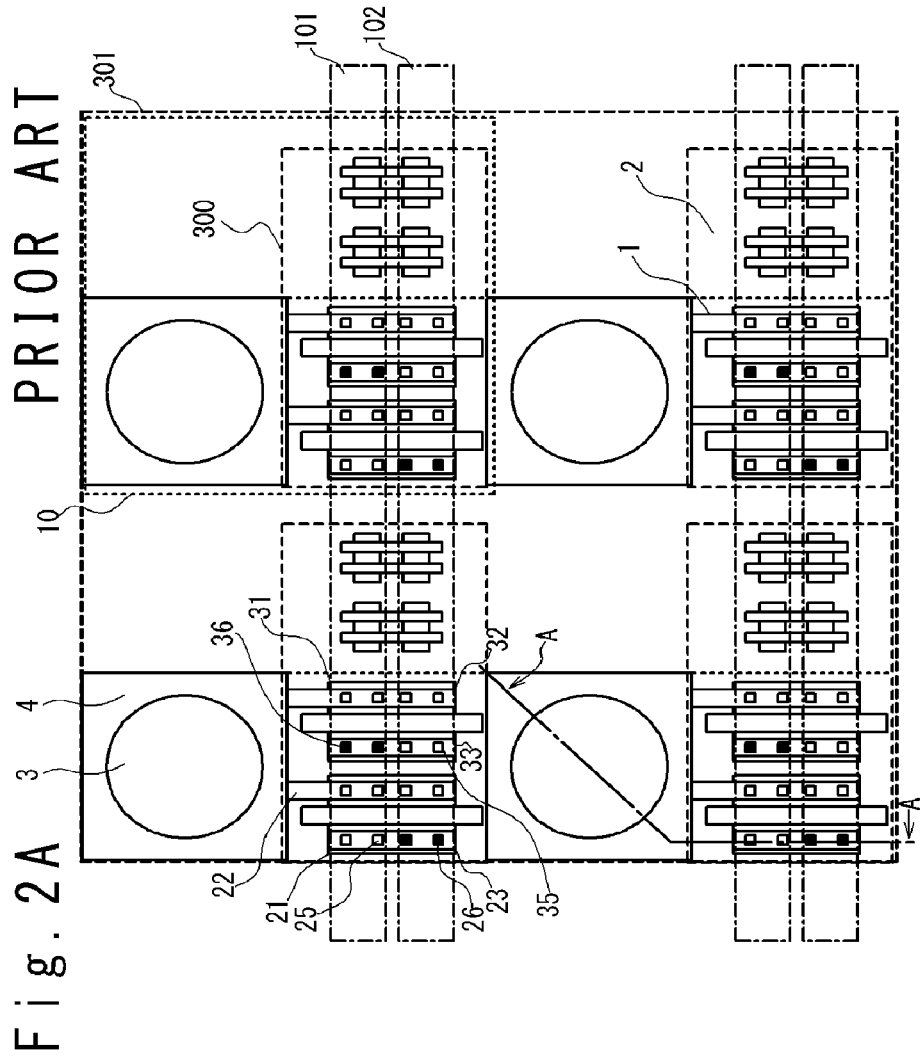
FIG. 2A is a partial plan view illustrating details of the example of the layout structure of the conventional semiconductor integrated circuit.

FIG. 2A is a partial plan view illustrating details of the exemplary layout structure of the conventional semiconductor integrated circuit. FIG. 2A illustrates a part of the layout structure illustrated in FIG. 1, that is, the structure of one unit structure set 301. In the following, a description is given of unit structures of the unit structure set 301 illustrated in FIG. 2A. As described above, each unit structure set 301 includes four unit structures 10. As described above, each of the four unit structures 10 includes an ESD protection circuitry 1, an arbitrarily-designed circuitry 2, a TSV bump 3 and a TSV interconnection 4. The ESD protection circuitry 1 includes a P-channel ESD protection element 21 and an N-channel ESD protection element 31. The P-channel ESD protection element 21 includes a drain interconnection 22, a source interconnection 23, through-hole contacts 25 (denoted by while squares) and through-hole vias 26 (denoted by black squares). The N-channel ESD protection element 31 includes a drain interconnection 32, a source interconnection 33, through-hole contacts 35 (denoted by while squares) and through-hole vias 36 (denoted by black squares).

The connections among the elements illustrated in FIG. 2A are as follows: The drain interconnections 22 and 32 are connected to the TSV bump 3. The source interconnection 23 is connected to a main VDD power line 102 by the through-hole vias 26. The source interconnection 33 is connected to a main VSS power line 101 by the through-hole vias 36.

Figure 2B:
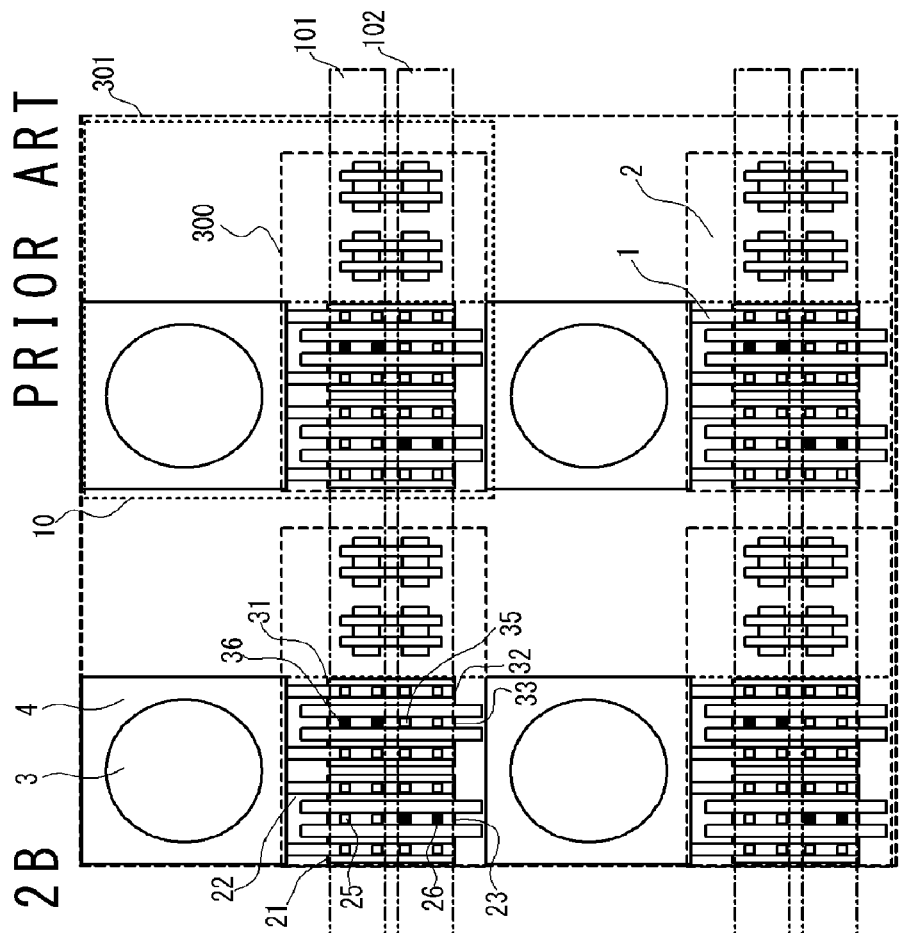
FIG. 2B is a partial plan view illustrating details of an example of the layout structure of a conventional semiconductor integrated circuit with a multi-finger gate structure.

FIG. 2B is a partial plan view illustrating details of an exemplary layout structure of a conventional semiconductor integrated circuit with a multi-finger gate structure. The layout structure illustrated in FIG. 2B is almost similar to that illustrated in FIG. 2A; the difference is that the P-channel and N-channel ESD protection elements 21 and 31 each have a multi-finger gate structure. The structures of other portions of the device illustrated in FIG. 2B are identical to those illustrated in FIG. 2A, and no further description is given of FIG. 2B.

FIG. 3A is a sectional view illustrating the cross section structure of the conventional semiconductor integrated circuit on section A-A illustrated in FIG. 2A. Illustrated in FIG. 3A are an N-well 104, a TSV bump 3, a TSV interconnection 4, a P-channel ESD protection element 21, a through-hole contacts 25, a source interconnection 23, a through-hole vias 26, a main VDD power line 102, and a main VSS power line 101.

It should be noted that, although only the P-channel ESD protection element 21 is described in the following, the N-channel ESD protection element 31 is understood as having a similar structure.

Referring to FIG. 3A, the P-channel ESD protection 21 includes a first portion 202 and a second portion 203. Here, the portion 202 is a portion located just under the main VDD line 102 of the P-channel ESD protection element 21. Similarly, the portion 203 is a portion located just under the main VSS line 101 of the P-channel ESD protection element 21. It should be noted that the P-channel ESD protection element 21 additionally includes a third portion 204 as described later.

The connections among the elements shown in FIG. 3A are as follows: The TSV bump 3 is formed through the N-well 104 and connected to the TSV interconnection 4. The P-channel ESD protection element 21 is formed in the surface portion of the N-well 104. The source interconnection 23 is formed in an interconnection layer positioned over the P-channel ESD protection element 21. The P-channel ESD protection element 21 and the source interconnection 23 are connected to each other via the through-hole contacts 25 provided therebetween. The main VDD power line 102 is formed in an interconnection layer positioned over the source interconnection 23. The source interconnection 23 is connected to the main VDD power line 102 via the through-hole vias 26.

The two arrows illustrated in FIG. 3A indicate first and second ESD discharging paths 200 and 201, which reach the main VDD power line 102 from the P channel ESD protection element 21.

The first ESD discharging path 200 passes through the through-hole contacts 25 positioned just above the first portion 202, penetrates the source interconnection 23, and reaches the main VDD power line 102, which is positioned in the upmost interconnection layer, via the through-hole vias 26.

The second ESD discharging path 201 passes through the through-hole contacts 25 positioned just above the second portion 203, passes through the source interconnection 23 in the horizontal direction, and reaches the main VDD power line 102, which is positioned in the upmost interconnection layer, via the through-hole vias 26.

Figure 3B:
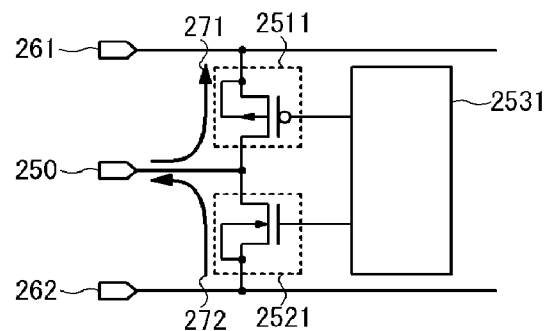
FIG. 3B is an equivalent circuit diagram indicating discharging paths in the case when ESD-protection and driver elements are disposed in an output buffer.

FIG. 3B is an equivalent circuit diagram indicating the discharging paths in the case when ESD protection and driver elements are provided in an output buffer. Illustrated in the equivalent circuit diagram of FIG. 3 are a TSV bump 250, a P-channel ESD protection and driver element 2511, an N-channel ESD protection and driver element 2521, a VDD power supply 261, a VSS power supply 262 and a pre-driver circuit 2531. The VDD power supply 261 is connected to the source of the P-channel ESD protection and driver element 2511. The drains of the P-channel and N-channel ESD protection and driver elements 2511 and 2521 are commonly connected to the TSV bump 250. Two outputs of the pre-driver circuit 2531 are connected to the gates of the P-channel and N-channel ESD protection and driver elements 2511 and 2521, respectively. The VSS power supply 262 is connected to the source of the N-channel ESD protection and driver element 2521. Two discharging paths 271 and 272 are illustrated in the equivalent circuit diagram of FIG. 3B. The first discharging path 271 reaches the VDD power supply 261 from the TSV bump 250 via the drain and source of the P-channel ESD protection and driver element 2511. The second discharging path 271 reaches the TSV bump 250 from VSS power supply 262 via the source and drain of the N-channel ESD protection and driver element 2521.

Figure 3C:
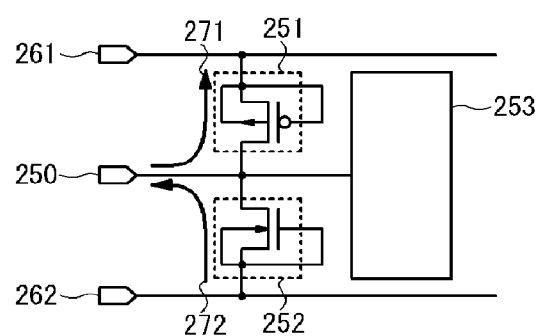
FIG. 3C is an equivalent circuit diagram indicating discharging paths in the case when ESD protection elements are disposed in an input buffer.

FIG. 3C is an equivalent circuit diagram indicating discharging paths in the case when ESD protection elements are provided in an input buffer. Illustrated in the equivalent circuit diagram of FIG. 3C are a TSV bump 250, a P-channel ESD protection element 251, an N-channel ESD protection element 252, a VDD power supply 261, a VSS power supply 262 and an input circuit 253. The VDD power supply 261 is connected to the source and gate of the P-channel ESD protection element 251. The TSV bump 250 is connected to the drains of the P-channel and N-channel ESD protection elements 251 and 252 and an input of the input circuit 253. The VSS power supply 262 is connected to the source and gate of the N-channel ESD protection element 252. Two discharging paths 271 and 272 are illustrated in the equivalent circuit diagram of FIG. 3C. The first discharging path 271 reaches the VDD power supply 261 from the TSV bump 250 via the drain and source of the P-channel ESD protection element 251. The second discharging path 272 reaches the TSV bump 250 from the VSS power supply 262 via the source and drain of the N-channel ESD protection element 252.

Note that the resistances of the first and second ESD discharging path 200 and 201, which are shown in FIG. 3A, are different from each other. The major components of the overall resistance of the first ESD discharging path 200 include the resistances of the through-hole contacts 25 and the through-hole vias 26. In general, a large number of through-hole contacts 25 and through-hole vias 26 are provided on the P-channel ESD protection element 21 and the source interconnection 23, respectively. Accordingly, the total resistances of the through-hole contacts 25 and through-hole vias 26 ranges from 0.1 to 0.2Ω in general.

The overall resistance of the second ESD discharging path 201, on the other hand, includes the resistance of the source interconnection 23 in addition to the overall resistance of the first ESD discharging path 200. The resistance of the source interconnection 23, which may depend on the layout of the semiconductor integrated circuit and the manufacture process, ranges from 0.1 to 1.0 Ω.

Considered in the following is the case in which the ratio of the resistances of the first and second ESD discharging paths 200 and 201 is 1:2 and the areas of the first and second portions 202 and 203 of the P-channel ESD protection element 21 are the same. Furthermore, the ESD discharging current necessary for satisfying the requirement of the ESD withstand voltage and the maximum ESD discharging ability of the P-channel ESD protection element 21 are both assumed as 3I amperes, where I is an arbitrary current level.

In such a case, a current of 2I amperes or below flows through the first ESD discharging path 200 and a current of 1I amperes or below flows through the second ESD discharging path 201, in accordance with the above-described resistance ratio. The maximum ESD discharging abilities of the first and second portions 202 and 203 of the P-channel ESD protection element 21 are, however, both 1.5I amperes. Accordingly, the ESC discharging ability of the first ESD discharging path 200 is restricted to 1.5I amperes, which is the maximum ESD discharging ability of the first portion 202. Similarly, the ESC discharging ability of the second ESD discharging path 201 is restricted to 1I amperes, which is the maximum ESD discharging ability of the source interconnection 23. As a result, the overall ESD discharging ability of the P-channel ESD protection element 21 is restricted to 2.5I amperes.

In order to allow flowing a current of 3I amperes, which is the original ESD discharging ability, through the P-channel ESD protection element 21, it is necessary to enlarge the size of the first portion 202, which is connected to the first ESD discharging path 200, of the P-channel ESD protection element 21 so that a current of 2I amperes can flow through the first portion 202. In the example of FIG. 3A, a third portion 204 is added to the P-channel ESD protection element 21.

The increase in the size of the P-channel ESD protection element 21, however, also increases the parasitic capacitances between the source interconnection 23 and the silicon substrate and between the drain interconnection 22 and the silicon substrate. In addition, the increase in the size of the P-channel ESD protection element 21 causes an increase in the power consumption of TSV wide I/O region due to an increase in the subthreshold leakage current.

Also, only ESD protection elements with a limited size can be arranged in such a narrow region as the standardized wide I/O region. This necessitates preparing an efficient layout structure so that size-limited ESD protection elements can fully exert the discharging ability.

In the following, a description is given of a semiconductor integrated circuit according to a first embodiment, in which the above-described problem is solved.

First Embodiment

Figure 4:
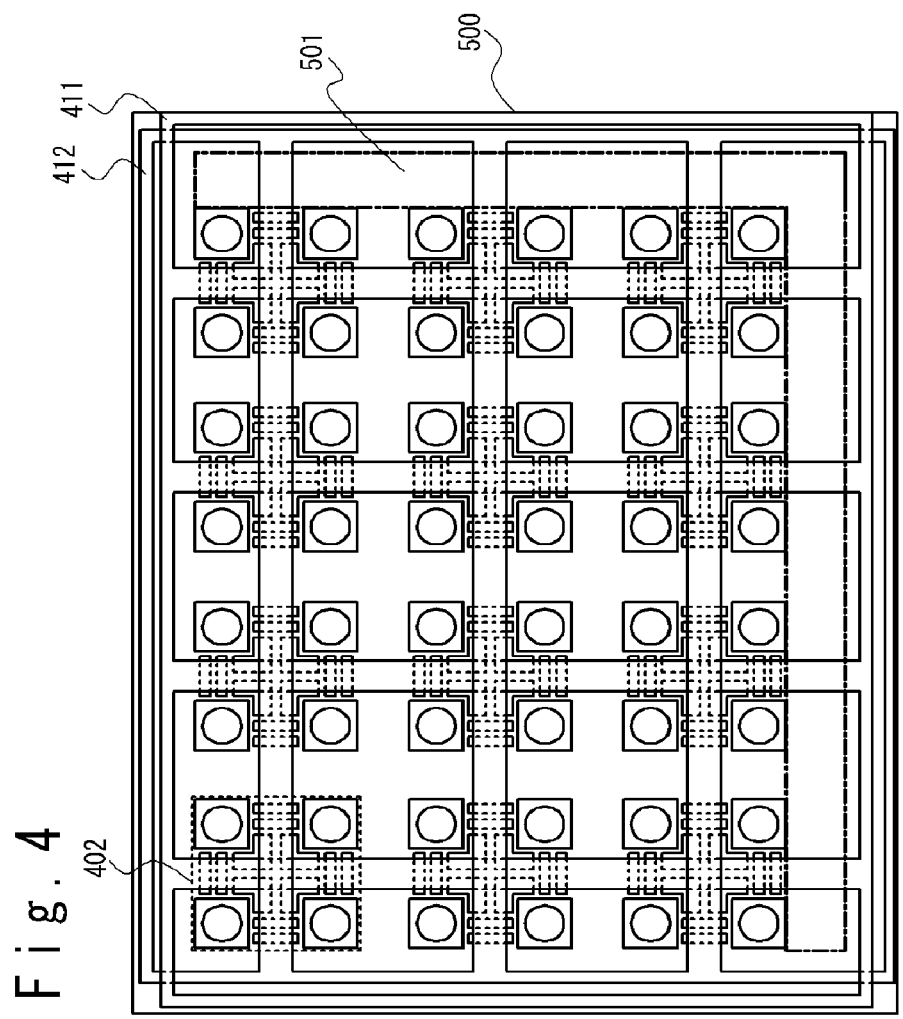
FIG. 4 is a plan view illustrating an exemplary layout structure of a semiconductor integrated circuit according to a first embodiment.

FIG. 4 is a plan view illustrating an exemplary layout structure of a semiconductor integrated circuit according to the first embodiment. In the following, a description is given of elements of the layout structure illustrated in FIG. 4. This layout structure is formed within a TSV array region 500 and includes a plurality of unit structure sets 402, main VSS power lines (first main power lines) 411 and main VDD power lines (second main power lines) 412. The voltage polarities of the first and second main power lines may be interchanged. In contrast to the conventional layout structure illustrated in FIG. 1, there is an undivided region 501, in which no unit structure sets 402 are formed, within the TSV array region 500 in the layout structure of the present embodiment.

Figure 5A:
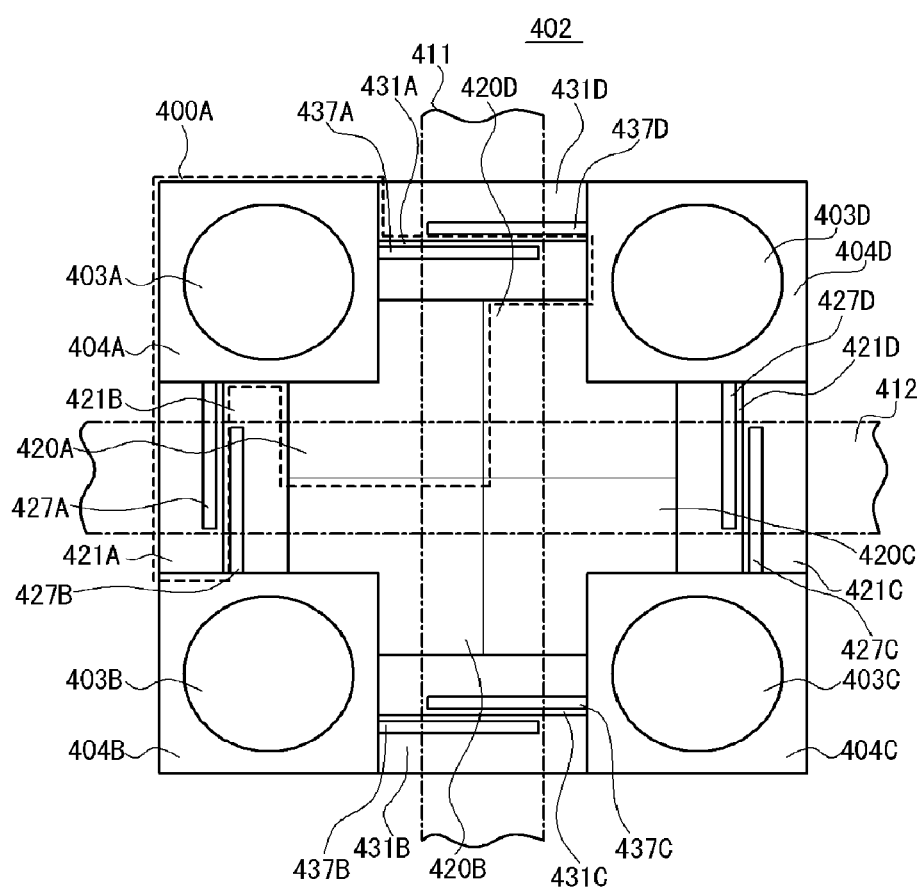
FIG. 5A is a plan view illustrating an exemplary structure of a unit structure set which forms the layout structure of the semiconductor integrated circuit in the first embodiment.

FIG. 5A is a plan view illustrating an exemplary structure of each unit structure set which forms the layout structure of the semiconductor integrated circuit according to the first embodiment. In the following, a description is given below of elements of each unit structure set 402 illustrated FIG. 5A. Each unit structure set 402 includes first to fourth TSV bumps 403A to 403D, first to fourth TSV interconnections 404A to 404D, first to fourth P-channel ESD protection elements 421A to 421D, first to fourth N-channel ESD protection elements 431A to 431D and first to fourth arbitrarily-designed circuitries 420A to 420D. In one embodiment, each of the P-channel ESD protection elements 421A to 421D may include a P-channel MOS transistor which provides ESD protection based on the snapback action of the parasitic bipolar transistor. Similarly, each of the N-channel ESD protection elements 431A to 431D may include an N-channel MOS transistor which provides ESD protection based on the snapback action of the parasitic bipolar transistor.

Each unit structure set 402 can be understood as including first to fourth unit structures. A first unit structure, denoted by numeral 400A, includes the first TSV bump 403A, the first TSV interconnection 404A, the first P-channel ESD protection element 421A, the first N-channel ESD protection element 431A, the first arbitrarily-designed circuitry 420A. The similar goes for the second to four unit structures.

In the following, a description is given of the connections among the elements in each unit structure set 402 illustrated in FIG. 5A. The first to fourth TSV bumps 403A to 403D included in first unit structure 400A are respectively disposed at the four corners of the square as defined in the standard. The first to fourth TSV interconnections 404A to 404D are formed around the first to fourth TSV bumps 403A to 403D.

The first TSV bump 403A and the fourth TSV bump 403D are arrayed adjacent to each other in a first direction, that is, the horizontal direction in FIG. 5A. Similarly, the second TSV bump 403B and the third 403D are arrayed adjacent to each other in the first direction. In contrast, the first TSV bump 403A and the second TSV bump 403B are arrayed adjacent to each other in a second direction orthogonal to the first direction, that is, the vertical direction in FIG. 5A. Similarly, the third TSV bump 403C and the fourth TSV bump 403D are arrayed adjacent to each other in the second direction.

The first and second P-channel ESD protection elements 421A and 421B are disposed between the first TSV bump 403A and the second TSV bump 403B. The drain interconnection 427A connected to the P-type drain region of the first P-channel ESD protection element 421A is connected to the first TSV bump 403A via the first TSV interconnection 404A. The connecting part of the drain interconnection 427A and the first TSV interconnection 404A may be collectively understood as an interconnection portion described later. The drain interconnection 427B connected to the P-type drain region of the second P-channel ESD protection element 421B is connected to the second TSV bump 403B via the second TSV interconnection 404B. The connecting part of the drain interconnection 427B and the second TSV interconnection 404B may be collectively understood as an interconnection portion described later.

The third and fourth P-channel ESD protection elements 421C and 421D are disposed between the third TSV bump 403C and the fourth TSV bump 403D. The drain interconnection 427C connected to the P-type drain region of the third P-channel ESD protection element 421C is connected to the third TSV bump 403C via the third TSV interconnection 404C. The connecting part of the drain interconnection 427C and the third TSV interconnection 404C may be collectively understood as an interconnection portion described later. The drain interconnection 427D connected to the P-type drain region of the fourth P-channel ESD protection element 421D is connected to the fourth TSV bump 403D via the fourth TSV interconnection 404D. The connecting part of the drain interconnection 427D and the fourth TSV interconnection 404D may be collectively understood as an interconnection portion described later.

The first and fourth N-channel ESD protection elements 431A and 431D are disposed between the first TSV bump 403A and the fourth TSV bump 403D. The drain interconnection 437A connected to the N-type drain region of the first N-channel ESD protection element 431A is connected to the first TSV bump 403A via the first TSV interconnection 404A. The connecting part of the drain interconnection 437A and the first TSV interconnection 404A may be understood as an interconnection portion. The drain interconnection 437D connected to the N-type drain region of the fourth N-channel ESD protection element 431D is connected to the fourth TSV bump 403D via the fourth TSV interconnection 404D. The connecting part of the drain interconnection 437D and the fourth TSV interconnection 404D may be understood as an interconnection portion.

The second and third N-channel ESD protection elements 431B and 431C are disposed between the second TSV bump 403B and the third TSV bump 403C. The drain interconnection 437B connected to the N-type drain region of the second N-channel ESD protection element 431B is connected to the second TSV bump 403B via the second TSV interconnection 404B. The connecting part of the drain interconnection 437B and the second TSV interconnection 404B may be understood as an interconnection portion described below. The drain interconnection 437C connected to the N-type drain region of the third N-channel ESD protection element 431C is connected to the third TSV bump 403B via the third TSV interconnection 404B. The connecting part of the drain interconnection 437C and the third TSV interconnection 404C may be understood as an interconnection portion described below.

The first to fourth arbitrarily-designed circuitries 420A to 420D are arranged at the center portion of the unit structure set 402. In other words, the first to fourth arbitrarily-designed circuitries 420A to 420D are arranged in a region surrounded by the first to fourth TSV bumps 403A to 403D, the first to fourth TSV interconnections 404A to 404D, the first to fourth P-channel ESD protection elements 421A to 421D and the first to fourth N-channel ESD protection elements 431A to 431D. The first to fourth arbitrarily-designed circuitries 420A to 420D are respectively disposed in the four sub-regions defined by dividing this region. Four I/O buffer circuits connected to the first to fourth TSV bumps 403A to 403D, respectively, may be arranged in the first to fourth arbitrarily-designed circuitries 420A to 420D, respectively.

Although the four unit structures included in the unit structure set 402 shown in FIG. 5A are arranged symmetrically in view of easy circuit design and the like, this arrangement is merely one example; the arrangements of the four unit structures may be modified. More specifically, the positions of the first and second P-channel ESD protection elements 421A and 421B, which are arrayed adjacent to each other, may be interchanged. Similarly, the positions of the first and fourth N-channel ESD protection elements 431A and 431D, which are arrayed adjacent to each other, may be interchanged. The same goes for other combinations of P-channel ESD protection elements arrayed adjacent to each other and other combinations of N-channel ESD protection elements arrayed adjacent to each other. The positions of ESD protection elements may be interchanged as long as two requirements are satisfied: one is that each TSV bump is connected to both of P-channel and N-channel ESD protection elements and the other is that each ESD protection element is disposed at a position at which the ESD protection element is connectable to the main power line corresponding to its conductivity type.

Furthermore, the positions of the first to fourth arbitrarily-designed circuitries 420A to 420D shown in FIG. 5A may be interchanged. More essentially, the shapes or the ratio of the areas of the first to fourth arbitrarily-designed circuitries 420A to 420D may be also freely modified.

Figure 5B:
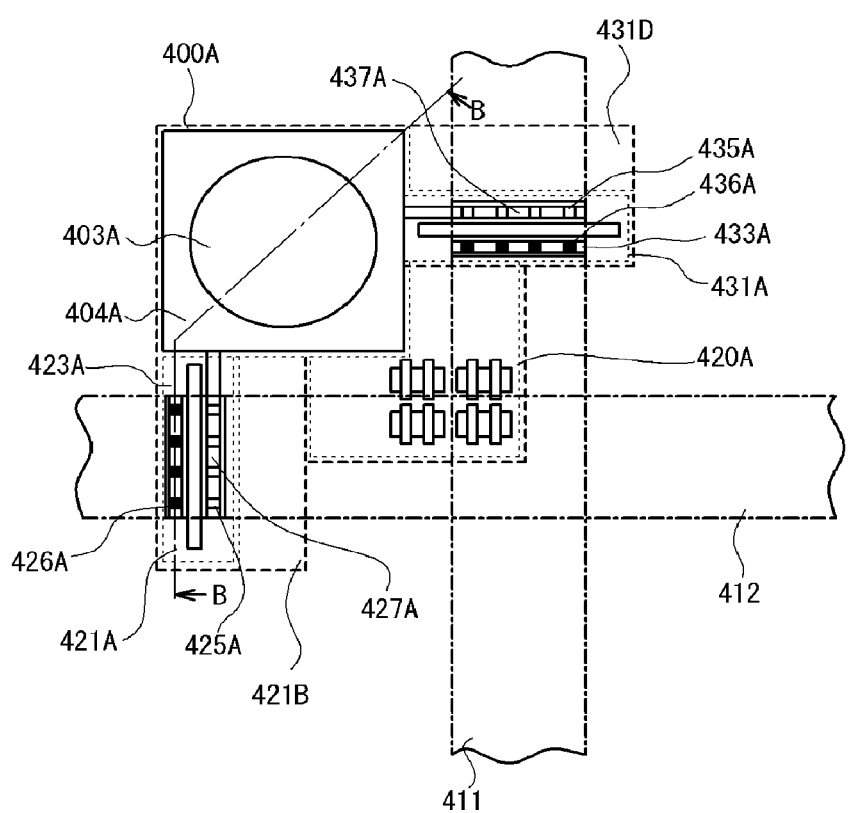
FIG. 5B is a plan view illustrating an exemplary structure of each unit structure of a unit structure set in the first embodiment.

FIG. 5B is a plan view illustrating an exemplary structure of each unit structure which forms the layout structure of the semiconductor integrated circuit according to the first embodiment. FIG. 5B, which is a partial plan view selectively illustrating the first unit structure 404A out of the four units structures included in the unit structure set 402 illustrated in FIG. 5A, illustrates details of the structures of the first P-channel ESD protection element 421A and the first N-channel ESD protection element 431A.

In the following, a description is given of elements of the unit structure 400A illustrated in FIG. 5B. The unit structure 400A includes the TSV bump 403A, the TSV interconnection 404A, the P-channel ESD protection element 421A, the N-channel ESD protection element 431A and the first arbitrarily-designed circuitry 420A.

The P-channel ESD protection element 421A includes a source interconnection 423A, a group of through-hole contacts 425A (denoted by while squares) and a group of through-hole vias 426A (denoted by black squares). The N-channel ESD protection element 431A includes a source interconnection 433A, a group of through-hole contacts 435A (denoted by while squares) and a group of through-hole vias 436A (denoted by black squares).

Figure 6:
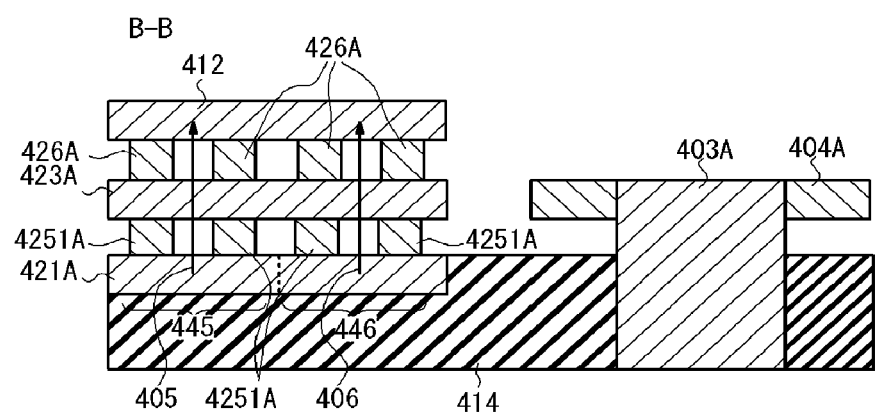
FIG. 6 is a sectional view illustrating an exemplary structure of the semiconductor integrated circuit on section B-B illustrated in FIG. 5B, in the first embodiment.

FIG. 6 is a sectional view illustrating an exemplary cross section structure of the semiconductor integrated circuit according to the first embodiment on section B-B illustrated in FIG. 6. In the following, a description is given of elements illustrated in the sectional view of FIG. 6. Illustrated in the sectional view of FIG. 6 are a first TSV bump 403A, a first TSV interconnection 404A, an N-well 414, a first P-channel ESD protection element 421A, a group of through-hole contacts 4251A, a source interconnection 423A, a group of through-hole vias 426A and a main VDD power line 412. First and second ESD discharging paths 405 and 406 are also illustrated in FIG. 6.

In the following, a description is given of the connections among the elements illustrated in the sectional view of FIG. 6. The first TSV bump 403A penetrates the N-well 414 at one end, and connected to the first TSV interconnection 404A at the other end. The first P-channel ESD protection element 421A is formed in the surface portion of the N-well 414. The source interconnection 423A is formed in an upper interconnection layer over the first P-channel ESD protection element 421A and connected to the first P-channel ESD protection element 421A via the group of through-hole contacts 4251A. The main VDD power line 412 is formed in an interconnection layer over the source interconnection 423A, and connected to the source interconnection 423A via the group of through-hole vias 426A. The group of through-hole contacts 4251A are formed under the group of through-hole vias 426A.

The structure of the first N-channel ESD protection element 431A is similar to the first P-channel ESD protection element 421A, except for that the conductivity type of the well and the polarity of the main power line are inverted.

In the following, a description is given of the first and second ESD discharging paths 405 and 406. As shown in FIG. 6, both of the first and second ESD discharging paths 405 and 406 reaches the main VDD power line 412 from the first P-channel ESD protection element 421A via the through-hole contacts 4251A and the through-hole vias 426A in the vertical direction. In contrast to the conventional structure illustrated in FIG. 3A, the first and second ESD discharging paths 405 and 406 have the substantially same resistance; none of the first and second ESD discharging paths 405 and 406 is routed via the source interconnection 423 in the horizontal direction.

Accordingly, the structure of the first embodiment illustrated in FIG. 6 does not require a portion corresponding to the third portion 204 illustrated in FIG. 3A, which is required by the conventional technique. As a result, the first embodiment enables reducing the size of the ESD protection elements, reducing the parasitic capacitances between the sources of the ESD protection elements and the silicon substrate and those between the drains of the ESD protection elements and the silicon substrate, reducing the leakage current, and saving the power consumption in the wide I/O region.

Also, in the first embodiment, four logic circuits respectively connected to the four TSV bumps 403A to 403D can be arranged in the four arbitrarily-designed circuitries 420A to 420D illustrated in FIG. 5A. This allows reducing the circuit size by the area of the region 501 without affecting easiness of routing among the ESD protection elements and logic circuit elements included in the I/O buffers. Accordingly, the structure of the first embodiment allows effectively reducing the chip size.

It should be noted that, although the above-description of the first embodiment is based on an assumption that ESD protection elements, each of which provides ESD protection based on the snapback action of the parasitic bipolar transistor of the MOS transistor, are used, the same advantageous effect can be obtained in the case when other ESD protection elements, such as ESD protection diodes, are used.

Second Embodiment

Figure 7:
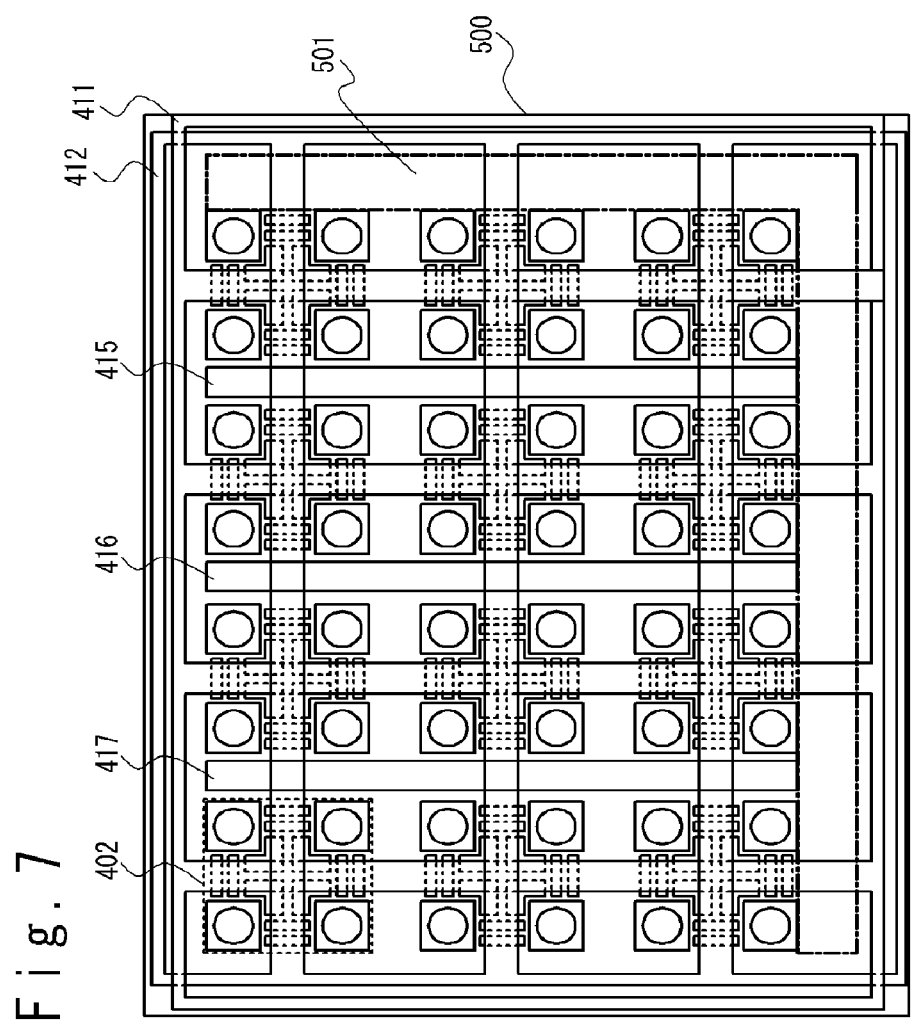
FIG. 7 is a plan view illustrating an exemplary layout structure of a semiconductor integrated circuit according to a second embodiment.

FIG. 7 is a partial plan view illustrating an exemplary layout structure of a semiconductor integrated circuit according to the first embodiment. The layout structure illustrated in FIG. 7 is almost similar to the layout structure of the first embodiment illustrated in FIG. 4; the difference is that first, second and third arbitrarily-designed circuitries 415, 416 and 417 are added to the layout structure illustrated in FIG. 7. The first to third arbitrarily-designed circuitries 415 to 417 are disposed between a plurality of unit structure sets integrated in the semiconductor substrate.

For example, some or all of the first to third arbitrarily-designed circuitries 415 to 417 may incorporate a capacitor element connected to a main VDD power line 412 and a main VSS power line 411, which are positioned in an upper interconnection layer. In this case, variations in the power supply voltages are reduced on the main VDD power line 412 and the VSS power line 411 and the noise immunity is improved.

Also, some or all of the first to third arbitrarily-designed circuitries 415 to 417 may incorporate an inter-power supply ESD protection element connected to a main VDD power line 412 and a main VSS power line 411, which are positioned in an upper interconnection layer. In this case, the ESD withstand voltages of the main VDD power line 412 and the main VSS power line 411 are improved.

Furthermore, if capacitance elements and arbitrarily-designed circuitries such as inter-power supply ESD protection circuits, which are conventionally arranged around the TSV array region 500, are arranged as the first to third arbitrarily-designed circuits 415 to 417 within the TSV array region 500, this effectively reduces the overall chip size of the semiconductor integrated circuit.

Third Embodiment

Figure 8B:
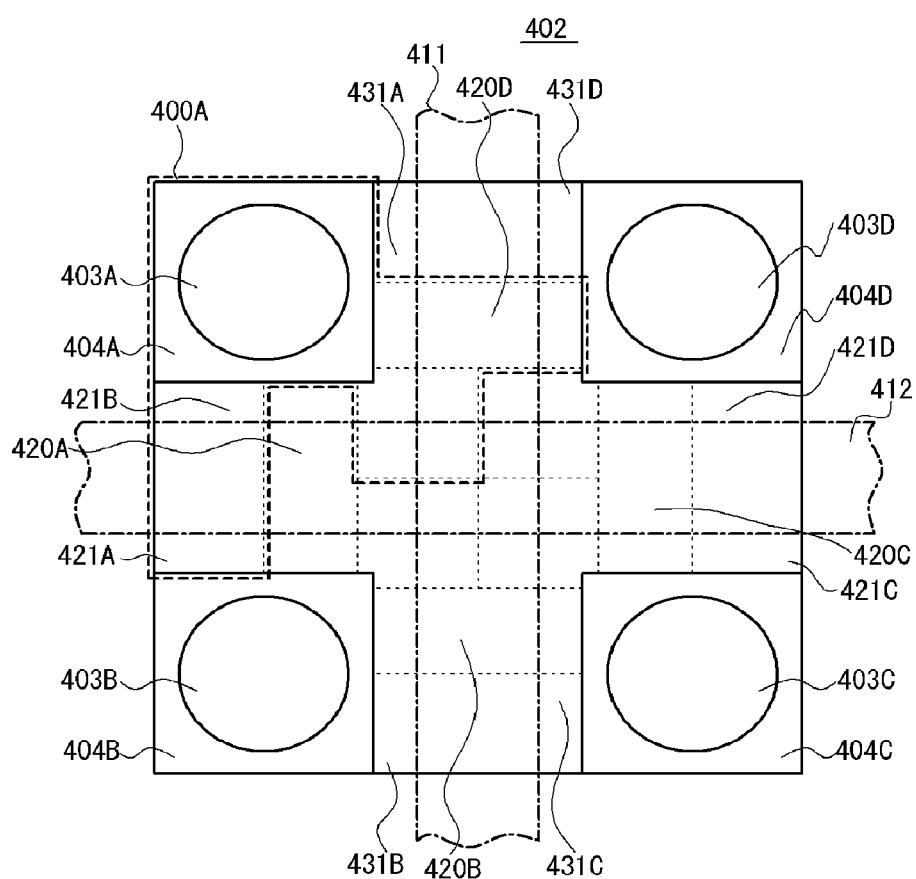
FIG. 8B is a plan view illustrating an exemplary structure of a unit structure set which forms the layout structure of the semiconductor integrated circuit in the third embodiment.
Figure 8C:
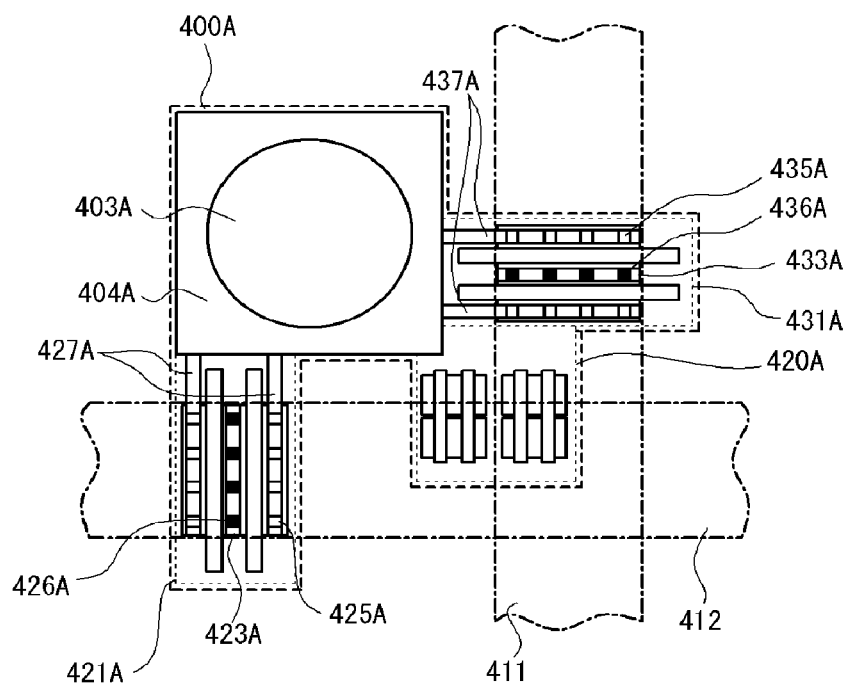
FIG. 8C is a plan view illustrating an exemplary structure of each unit structure of the unit structure set in the third embodiment.

FIG. 8A is a plan view illustrating an exemplary layout structure of a semiconductor Integrated circuit in a third embodiment. FIG. 8B is a plan view illustrating an exemplary structure of each unit structure set which forms the layout structure of the semiconductor integrated circuit in the third embodiment. FIG. 8C is a plan view illustrating an exemplary structure of each unit structure which forms the unit structure set of the semiconductor integrated circuit in the third embodiment.

In the following, a description is given of the layout structure illustrated in FIG. 8A. The layout structure of the third embodiment is almost similar to that of the first embodiment illustrated in FIG. 4; the difference exists in the structure of each unit structure set as described later.

In the following, a description is given of the structure of the unit structure set illustrated in FIG. 8B. The structure of the unit structure set of the third embodiment is obtained by modifying the structure of the unit structure set of the first embodiment (which is illustrated in FIG. 5A) as follows: First, the area of each of the first to fourth P-channel ESD protection elements 421A to 421D in the third embodiment is larger than that in the first embodiment. Similarly, the area of each of the first to fourth N-channel ESD protection elements 431A to 431D in the third embodiment is larger than that in the first embodiment. As a result, the area of each of the first to fourth arbitrarily-designed circuitries 420A to 420D in the third embodiment is smaller than that in the first embodiment.

It should be noted that the unit structures 400A to 400D are arranged in rotational symmetry for rotations of 90 degrees, 180 degrees and 270 degrees in the exemplary structure illustrated in FIG. 8B.

In the following, a description is given of the unit structure illustrated in FIG. 8C. The unit structure of the third embodiment is obtained by modifying that of the first embodiment (illustrated in FIG. 5B) as follows: In this embodiment, the P-channel and N-channel ESD protection elements 421A and 431A each include a MOS transistor with a multi-finger gate structure; the P-channel and N-channel ESD protection elements 421A and 431A each include a plurality of gate fingers.

In the exemplary structure illustrated in FIG. 8C, the drain regions of the multi-finger gate MOS transistors are extended in the first or second direction with respect to the TSV interconnections. Note that the drain region of each MOS transistor is connected to a TSV interconnection and a TSV bump via a drain interconnection. As a result, a sufficient ESD discharging ability is obtained for the case when a multi-finger gate structure is used, and the same advantageous effect as the first embodiment is achieved.

The structure of the remainder of the semiconductor integrated circuit in the third embodiment illustrated in FIGS. 8A to 8C is similar to that in the first embodiment illustrated in FIGS. 4, 5A and 5B. Therefore, no further description of the structure of the remainder of the semiconductor integrated circuit illustrated in FIGS. 8A to 8C is given.

The operation and advantageous effect of the semiconductor integrated circuit of the third embodiment are also the same as those of the first embodiment, except for that the protection ability is enhanced due to the use of the multi-finger gate structure in each ESD protection element. Therefore, no further description is given of the operation and advantageous effect of the semiconductor integrated circuit of the third embodiment.

Fourth Embodiment

Figure 9C:
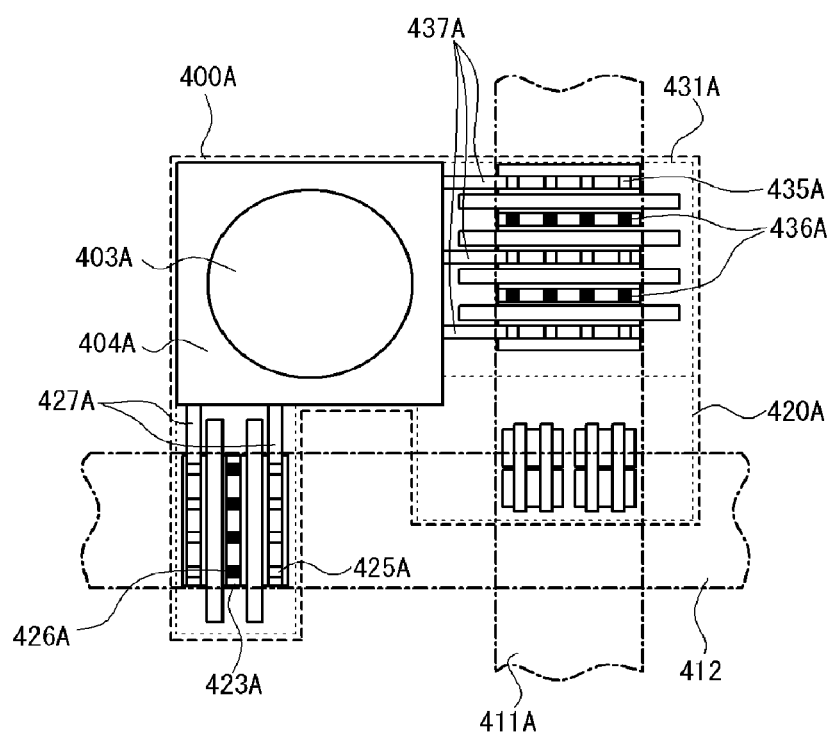
FIG. 9C is a plan view illustrating an exemplary structure of each unit structure of the unit structure set in the fourth embodiment.

FIG. 9A is a plan view illustrating an exemplary layout structure of a semiconductor integrated circuit in a fourth embodiment. FIG. 9B is a plan view illustrating an exemplary structure of each unit structure set which forms the layout structure of the semiconductor integrated circuit in the fourth embodiment. FIG. 9C is a plan view illustrating an exemplary structure of each unit structure which forms the unit structure set of the semiconductor integrated circuit in the fourth embodiment.

In the following, a description is given of the layout structure illustrated in FIG. 9A. The layout structure of the fourth embodiment is almost similar to that of the third embodiment illustrated in FIG. 8A; the difference exists in that the area of the region 501 is reduced in connection with the increase in the area of each unit structure set as described later.

In the following, a description is given of the structure of the unit structure set illustrated in FIG. 9B. The structure of the unit structure set of the fourth embodiment is obtained by modifying the structure of the unit structure set of the third embodiment (which is illustrated in FIG. 8B) as follows: In the first embodiment, all of the P-channel ESD protection elements 421A to 421D, the N-channel ESD protection elements 431A to 431D and the arbitrarily-designed circuitries 420A to 420D are accommodated in the region surrounded by the four TSV bumps 403A to 403D. In contrast, in the fourth embodiment, some of the P-channel ESD protection elements 421A to 421D, the N-channel ESD protection elements 431A to 431D and the arbitrarily-designed circuitries 420A to 420D are extended to the outside of the region surrounded by the four TSV bumps 403A to 403D. This results from the increase in the area of each unit structure. Attention should be paid to the fact that the portions outside the region surrounded by the four TSV bumps 403A to 403D are located in the first direction with respect to the region. In other word, the elements of each unit structure set are not extended to the outside of the region surrounded by the four TSV bumps 403A to 403D in the second direction with respect to the region; this implies that a continuous region extended in the first direction can be obtained.

In the following, a description is given of each unit structure illustrated in FIG. 9C. The unit structure of the fourth embodiment is obtained by modifying that of the third embodiment (illustrated in FIG. 8C) as follows: In the fourth embodiment, the size of the N-channel ESD protection element 431A is further increased from that in the third embodiment. It should be additionally noted that this results in not only the above-described extension of the elements but also the loss of the symmetry in the shapes of the four unit structure included in each unit structure set. The asymmetry in the shape, however, does not directly influence the circuit function.

The structure of the remainder of the semiconductor integrated circuit in the fourth embodiment illustrated in FIGS. 9A to 9C is similar to that in the third embodiment illustrated in FIGS. 8A to 8C, and therefore no further description of the structure of the remainder of the semiconductor integrated circuit illustrated in FIGS. 8A to 8C is given.

The operation and advantageous effect of the semiconductor integrated circuit of the fourth embodiment are also the same as those of the third embodiment, except for that the protection ability is enhanced due to the increase in the size of the N-channel ESD protection element 431A. Therefore, no further description is given of the operation and advantageous effect of the semiconductor integrated circuit of the fourth embodiment.

Note that, although FIG. 9C illustrates the structure in which the size of the N-channel ESD protection element 431A is increased, this structure is merely one example; the size of the P-channel ESD protection element 421A may be increased instead.

Fifth Embodiment

Figure 10B:
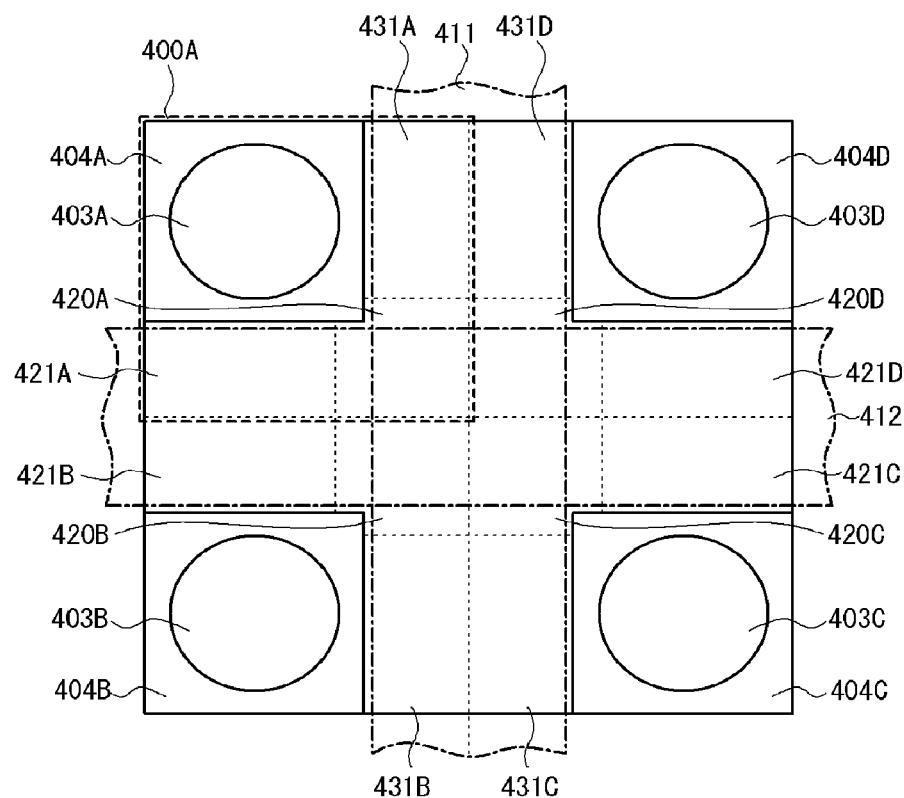
FIG. 10B is a plan view illustrating an exemplary structure of a unit structure set which forms the layout structure of the semiconductor integrated circuit in the fifth embodiment.
Figure 10C:
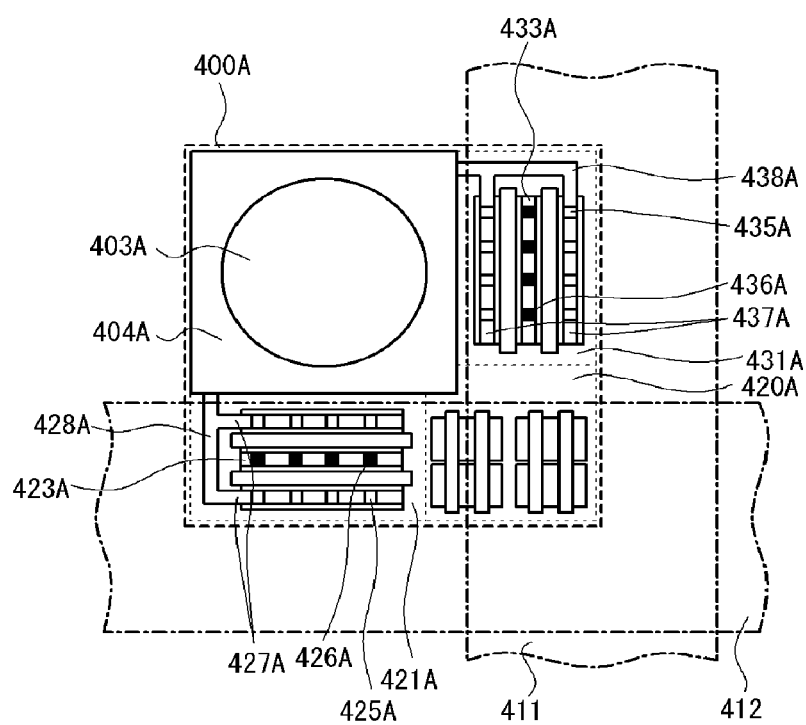
FIG. 10C is a plan view illustrating an exemplary structure of each unit structure of the unit structure set in the fifth embodiment.

FIG. 10A is a plan view illustrating an exemplary layout structure of a semiconductor integrated circuit in a fifth embodiment. FIG. 10B is a plan view illustrating an exemplary structure of each unit structure set which forms the layout structure of the semiconductor integrated circuit in the fifth embodiment. FIG. 10C is a plan view illustrating an exemplary structure of each unit structure which forms the unit structure set of the semiconductor integrated circuit in the fifth embodiment.

In the following, a description is given of the layout structure illustrated in FIG. 10A. The layout structure of the fifth embodiment is almost similar to that of the third embodiment illustrated in FIG. 8A; the difference exists in the structure of each unit structure set as described later.

In the following, a description is given of the structure of the unit structure set illustrated in FIG. 10B. The structure of the unit structure set of the fifth embodiment is obtained by modifying the structure of the unit structure set of the third embodiment (which is illustrated in FIG. 8B) as follows: In the fifth embodiment, the P-channel ESD protection elements 421A to 421D and the N-channel ESD protection elements 431A to 431D are arranged so that the longitudinal directions (or the gate width directions) of the P-channel ESD protection elements 421A to 421D and the N-channel ESD protection elements 431A to 431D are respectively directed along the TSV bumps 403A to 403D, to which the P-channel ESD protection elements 421A to 421D and the N-channel ESD protection elements 431A to 431D are respectively connected. In the first to fourth embodiments, as illustrated in FIGS. 5B, 8C and 9C, the P-channel ESD protection elements 421A to 421D (especially, the drain interconnections 427A to 427D thereof) are disposed to extend in the directions outward of the TSV bumps 403A to 403D, respectively, from the insides. Similarly, in the first to fourth embodiment, the N-channel ESD protection elements 431A to 431D (especially, the drain interconnections 437A to 437D thereof) are disposed to extend in the directions outward of the TSV bumps 403A to 403D, respectively, from the insides. In contrast, in the fifth embodiment illustrated in FIG. 10B, the P-channel ESD protection elements 421A to 421D, the drain interconnections 427A to 427D thereof, the N-channel ESD protection elements 431A to 431D and the drain interconnections 437A to 437D thereof are disposed to extend in the directions perpendicular to the directions outward of the TSV bumps 403A to 403D, respectively, from the insides.

It should be noted that, in the exemplary structure illustrated in FIG. 10B, the unit structures 400A to 400D are arranged in rotational symmetry with one another for rotations of 90 degrees, 180 degrees and 270 degrees.

In the following, a description is given of each unit structure illustrated in FIG. 10C. The unit structure of the fifth embodiment is obtained by modifying that of the third embodiment (illustrated in FIG. 8C) as follows: First, as described above, the P-channel ESD protection elements 421A to 421D and the N-channel ESD protection elements 431A to 431D are arranged so that the longitudinal directions of the P-channel ESD protection elements 421A to 421D and the N-channel ESD protection elements 431A to 431D are respectively directed along the TSV bumps 403A to 403D, to which the P-channel ESD protection elements 421A to 421D and the N-channel ESD protection elements 431A to 431D are respectively connected. Furthermore, when each of the P-channel ESD protection elements 421A to 421D include a multi-finger gate, a plurality of drains of each of the P-channel ESD protection elements 421A to 421D are connected to the TSV bumps 403A to 403D in parallel via interconnections 428A to 428D. Similarly, when each of the N-channel ESD protection elements 431A to 431D include a multi-finger gate, a plurality of drains of each of the N-channel ESD protection elements 431A to 431D are connected to the TSV bumps 403A to 403D in parallel via interconnections 438A to 438D.

In the exemplary structure illustrated in FIG. 10C, it may be necessary to take further measures to equalize the currents through the drains connected to a TSV bump via the same interconnection.

The structure of the remainder of the semiconductor integrated circuit in the fifth embodiment illustrated in FIGS. 10A to 10C is similar to that in the third embodiment illustrated in FIGS. 8A to 8C. Therefore, no further description of the structure of the remainder of the semiconductor integrated circuit illustrated in FIGS. 10A to 10C is given.

The operation and advantageous effect of the semiconductor integrated circuit of the fifth embodiment are the same as those of the third embodiment. Therefore, no further description is given of the operation and advantageous effect of the semiconductor integrated circuit of the fifth embodiment.

Sixth Embodiment

Figure 11B:
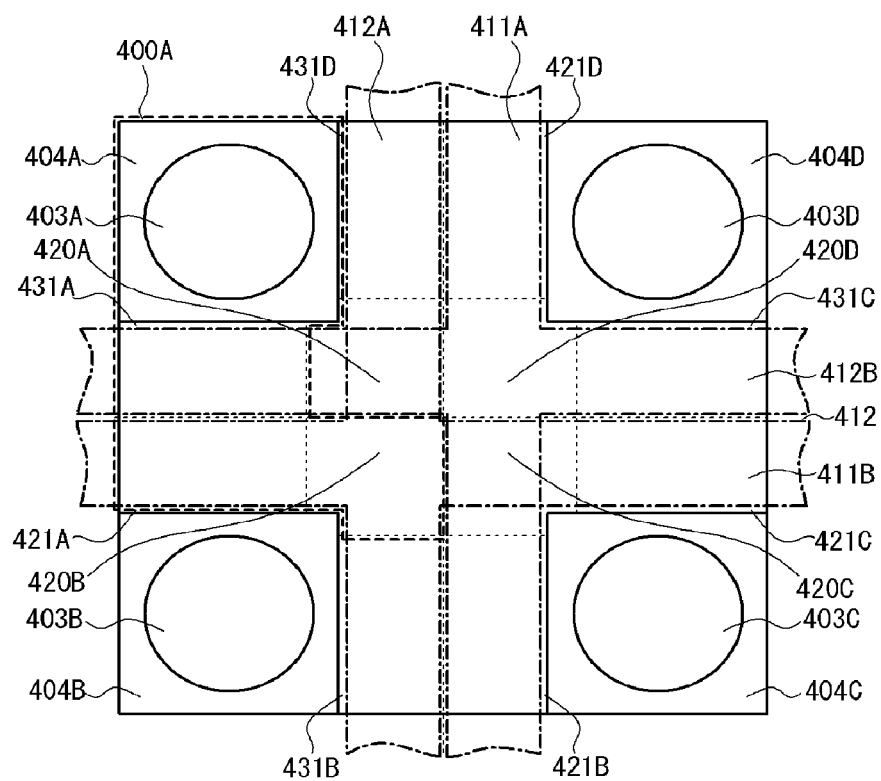
FIG. 11B is a plan view illustrating an exemplary structure of a unit structure set which forms the layout structure of the semiconductor integrated circuit in the sixth embodiment.
Figure 11C:
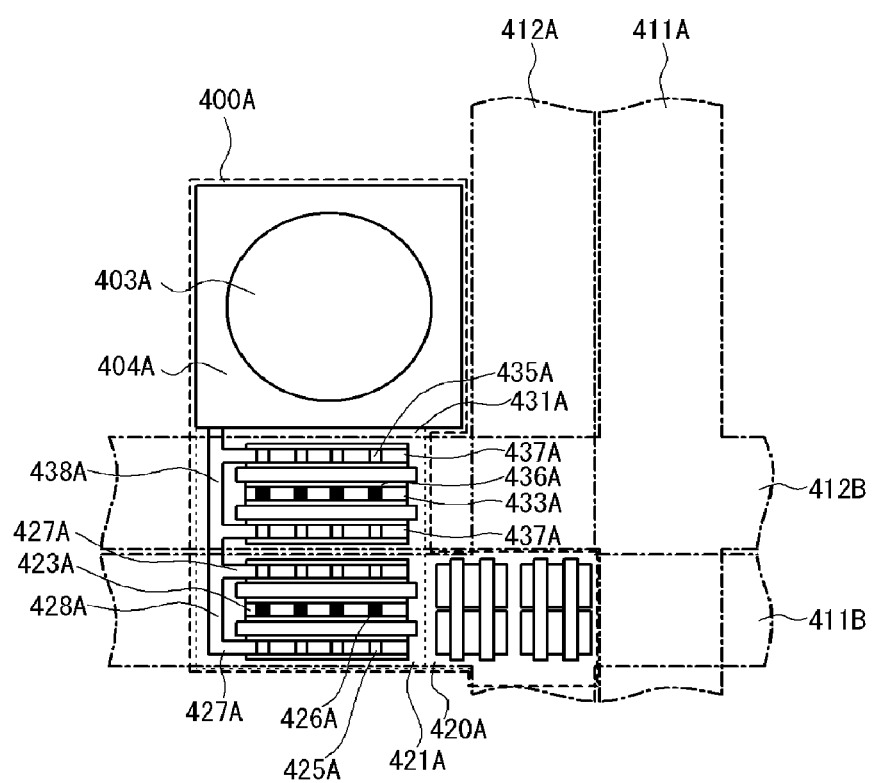
FIG. 11C is a plan view illustrating an exemplary structure of each unit structure of the unit structure set in the sixth embodiment.

FIG. 11A is a plan view illustrating an exemplary layout structure of a semiconductor integrated circuit in a sixth embodiment. FIG. 11B is a plan view illustrating an exemplary structure of each unit structure set which forms the layout structure of the semiconductor integrated circuit in the sixth embodiment. FIG. 11C is a plan view illustrating an exemplary structure of each unit structure which forms the unit structure set of the semiconductor integrated circuit in the sixth embodiment.

In the following, a description is given of the layout structure illustrated in FIG. 11A. The layout structure of the sixth embodiment is obtained by modifying the layout structure of the fifth embodiment (which is illustrated in FIG. 10A) as follows: First, for each first main power line 411 and each second main power line 412, the width of the portion overlapping each ESD protection element is reduced to about the half. Second, power line pairs each including one first power line 411 and one second power line 412 are disposed to extend in the first and second directions, and arranged to overlap ESD protection elements. Furthermore, the shape of each unit structure set is different as described below.

In the following, a description is given of the structure of each unit structure set illustrated in FIG. 11B. The structure of the unit structure set of the fifth embodiment is obtained by modifying the structure of the unit structure set of the fifth embodiment (which is illustrated in FIG. 10B) as follows: The P-channel ESD protection elements 421A and the N-channel ESD protection elements 431A are arrayed in the same direction with respect to the TSV bump 403A, to which the P-channel ESD protection elements 421A and the N-channel ESD protection elements 431A are connected. The similar goes for the P-channel ESD protection elements 421B to 421D and the N-channel ESD protection elements 431B to 431D. The P-channel ESD protection elements 421B and the N-channel ESD protection elements 431B are arrayed in the same direction with respect to the TSV bump 403B, the P-channel ESD protection elements 421C and the N-channel ESD protection elements 431C are arrayed in the same direction with respect to the TSV bump 403C, and the P-channel ESD protection elements 421D and the N-channel ESD protection elements 431D are arrayed in the same direction with respect to the TSV bump 403D.

It should be noted that, in the exemplary example illustrated in FIG. 11B, the unit structures 400A to 400D are arranged in rotational symmetry with one another for rotations of 90 degrees, 180 degrees and 270 degrees.

In the following, a description is given of each unit structure illustrated in FIG. 11C. The unit structure 400A of the sixth embodiment is obtained by modifying that of the fifth embodiment (illustrated in FIG. 10C) as follows: As described above, the P-channel ESD protection elements 421A and the N-channel ESD protection elements 431A are arrayed in the same direction with respect to the TSV bump 403A, to which the P-channel ESD protection elements 421A and the N-channel ESD protection elements 431A are connected. In addition, an interconnection 428A which connects the P-channel ESD protection element 421A to the TSV bump 403A and an interconnection 438A which connects the N-channel ESD protection element 431A to the TSV bump 403A are connected to each other. Further, as described above, the first main power line 411 and the second main power line 412 are extended in parallel with the widths thereof reduced down to the half. As a result, the P-channel ESD protection element 421A is connected to the first main power line 411 and the N-channel ESD protection element 431A is connected to the second main power line 412.

In the exemplary structure illustrated in FIG. 11C, it may be necessary to take further measures to equalize the currents through the drains connected to a TSV bump via the same interconnection.

The structure of the remainder of the semiconductor integrated circuit in the sixth embodiment illustrated in FIGS. 11A to 11C is similar to that in the fifth embodiment illustrated in FIGS. 10A to 10C. Therefore, no further description of the structure of the remainder of the semiconductor integrated circuit illustrated in FIGS. 11A to 11C is given.

The operation and advantageous effect of the semiconductor integrated circuit of the sixth embodiment are also the same as those of the fifth embodiment, except for that the protection ability is enhanced due to the use of the multi-finger gate structure in each ESD protection element. Therefore, no further description is given of the operation and advantageous effect of the semiconductor integrated circuit of the sixth embodiment.

Although embodiments of the present invention are specifically described in the above, the present invention is not limited to the above-described embodiments; the present invention may be implemented with modifications which do not depart from the concept of the present invention. It should be noted that the features described in the above-described embodiment may be arbitrarily combined as long as no technical inconsistency is raised.

What is claimed is:

1. A semiconductor integrated circuit, comprising:
   a first TSV bump;
   a second TSV bump arranged in a first direction with said first TSV bump;
   a third TSV bump arranged in a second direction which is perpendicular to said first direction with said first TSV bump;
   a plurality of I/O buffers coupled to said first, second, and third TSV bumps, respectively;
   first and second power lines;
   a first P-channel ESD protection circuit which is supplied a first voltage by said first power line and disposed between said first and second TSV bumps; and
   a first N-channel ESD protection circuit which is supplied a second voltage by said second power line and disposed between said first and third TSV bumps,
   wherein said first power line is disposed to overlap said first P-channel ESD protection circuit,
   wherein said second power line is disposed to overlap said first N-channel ESD protection circuit.

2. The semiconductor integrated circuit according to claim 1, further comprising:
   third and fourth power lines;
   a second P-channel ESD protection circuit which is supplied said first voltage by said third power line and disposed between said first and second TSV bumps; and
   a second N-channel ESD protection circuit which is supplied said second voltage by said fourth power line and disposed between said first and third TSV bumps.

* * * * *